United States Patent [19]

Ishibashi et al.

[11] Patent Number: 5,908,306
[45] Date of Patent: Jun. 1, 1999

[54] METHOD FOR MAKING A SEMICONDUCTOR DEVICE EXPLOITING A QUANTUM INTERFERENCES EFFECT

[75] Inventors: Akira Ishibashi, Kanagawa, Japan; David G. Ravenhall, Urbana, Ill.; Roy L. Schult, Urbana, Ill.; Henry W. Wyld, Urbana, Ill.

[73] Assignees: Sony Corporation, Tokyo, Japan; The Board of Trustees of the University of Illinois, Urbana, Ill.

[21] Appl. No.: 08/011,202

[22] Filed: Jan. 29, 1993

[51] Int. Cl.$^6$ ..................................................... H01L 21/20
[52] U.S. Cl. ........................... 438/172; 438/483; 438/572
[58] Field of Search ................................... 257/12, 20, 24, 257/27, 192, 195, 328, 14, 15, 17, 22; 438/44, 46, 47, 94, 92, 93, 167, 172, 481, 483, 484, 572, 590, 602, 604, 606, 646, 767, 779

[56] References Cited

U.S. PATENT DOCUMENTS

| | | | |
|---|---|---|---|
| 4,581,621 | 4/1986 | Reed | 257/20 |
| 4,729,000 | 3/1988 | Abrokwah | 257/195 |
| 4,796,068 | 1/1989 | Katayama et al. | 257/20 |
| 4,916,499 | 4/1990 | Kawai | 257/192 |
| 5,157,467 | 10/1992 | Fujii | 257/192 |
| 5,234,848 | 8/1993 | Seabaugh | 438/177 |
| 5,412,223 | 5/1995 | Ishibashi et al. | 257/20 |
| 5,428,224 | 6/1995 | Hayashi et al. | 257/24 |
| 5,447,873 | 9/1995 | Randall et al. | 438/172 |
| 5,705,827 | 1/1998 | Baba et al. | 257/20 |
| 5,811,831 | 9/1998 | Isihbashi et al. | 257/192 |

FOREIGN PATENT DOCUMENTS

| | | | |
|---|---|---|---|
| 1225175 | 9/1989 | Japan | 257/27 |
| 2134830 | 5/1990 | Japan | 257/192 |
| 2156681 | 6/1990 | Japan | 257/192 |
| 3165576 | 7/1991 | Japan | 257/12 |

OTHER PUBLICATIONS

Onda et al, "Stripep Channel Field Effect Transistors With a Modulation Doped Structure", IEDM, 1989 pp. 125–128. (IEEE International Electron Device Meeting).

*Primary Examiner*—John F. Niebling
*Assistant Examiner*—S. Mulpuri
*Attorney, Agent, or Firm*—Hill & Simpson

[57] ABSTRACT

A semiconductor device exploiting a quantum interference effect is disclosed. The device comprises: a channel region connected multiply with multiplicity of n ($n \geq 3$) and having (n−1)-fold rotational symmetry around an axis of the channel region; a gate electrode surrounding a side wall of the channel region; and source and drain electrodes electrically connected to one and another end of the channel region along the axis. Electrons move in an effective channel region along or around the axis from the source toward the drain. Electron interference in the effective channel region is controlled by a magnetic field applied in the axis direction and/or the gate electrode.

3 Claims, 5 Drawing Sheets

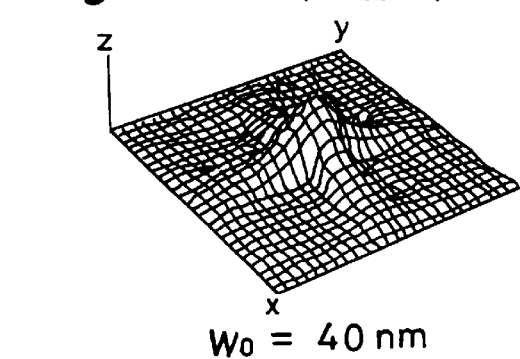
Fig. 3C  E(meV)=2.316
Wo = 40 nm
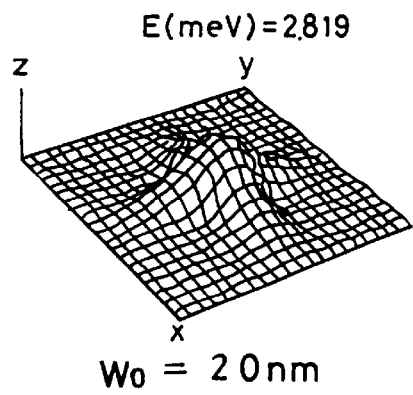
Fig. 3A  E(meV)=2.819
Wo = 20 nm
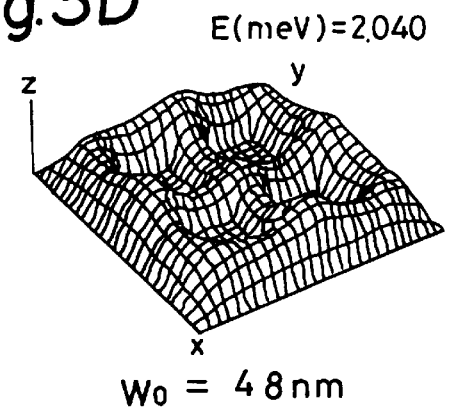
Fig. 3D  E(meV)=2.040
Wo = 48 nm
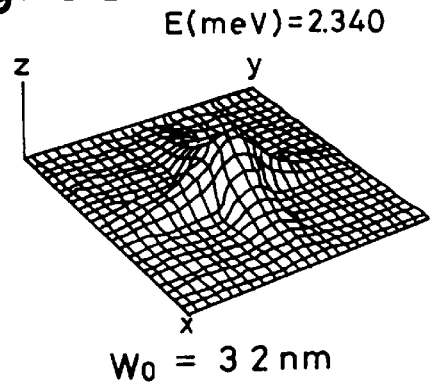
Fig. 3B  E(meV)=2.340
Wo = 32 nm
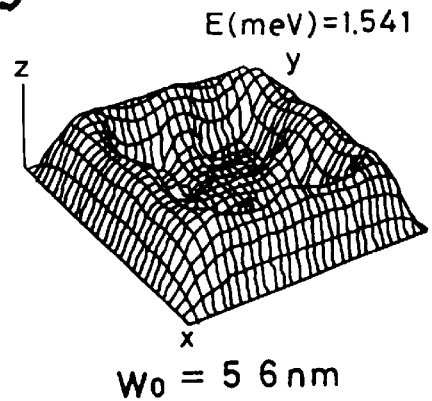
Fig. 3E  E(meV)=1.541
Wo = 56 nm

METHOD FOR MAKING A SEMICONDUCTOR DEVICE EXPLOITING A QUANTUM INTERFERENCES EFFECT

BACKGROUND OF THE INVENTION

1. Field of the Invention

This invention relates to a semiconductor device exploiting a quantum interference effect.

2. Description of the Prior Art

Channels in existing semiconductor devices such as MOSFET, MESFET and JFET have a simply connected structure from a topological viewpoint. Since such semiconductor devices effect on-off actions by controlling conduction and non-conduction of the channel, they are available only for simple operations.

Recently, various quantum interference devices utilizing an interference effect of electrons have been proposed for realizing more complicated and advanced operations (see, for example, Technical Digest of IEDM 86, pp. 76–79). However, major part of quantum interference devices heretofore proposed uses a channel of a doubly connected structure. Therefore, they do not provide an advanced interference effect, and their interference modes are limited.

In addition, to the best of the knowledge of the present inventors, there has been no indication or suggestion about realization of a quantum interference device using a channel of a high multiplicity not less than three.

OBJECT AND SUMMARY OF THE INVENTION

It is therefore an object of the invention to provide a semiconductor device exploiting a quantum interference effect that gives an advanced interference effect and increases the variety of interference modes.

Another object of the invention is to provide a method for manufacturing a semiconductor device exploiting a quantum interference effect that gives an advanced interference effect and increases the variety of interference modes.

According to an aspect of the invention, there is provided a semiconductor device exploiting a quantum interference effect comprising:

(a) a semiconductor body;

(b) n−1 (n≧3) rods of forbidden regions extending along one direction in the semiconductor body;

(c) a channel region consisting of a plurality of elemental channel regions, the forbidden regions being provided to divide the channel region into the plurality of elemental channel regions, each of the elemental channel regions forming a closed circuit and being defined around each of the forbidden regions, the channel region being multiply connected with multiplicity of n and having (n−1)-fold rotational symmetry around the one direction;

(d) a gate electrode surrounding a side wall of the channel region; and (e) source and drain electrodes electrically connected to one and another end of the channel region along the one direction.

In the semiconductor device exploiting a quantum interference effect having the foregoing construction, since the channel region has a structure connected multiply with multiplicity of n (n≧3), more advanced interference effect is obtained as compared with a device using a channel region of a doubly connected structure. In addition, since the channel region has an (n−1)-fold rotational symmetry, car- rier distribution in a cross section of the channel region can be made quasiuniform, and the interference effect is thereby improved. Further, variety of interference modes can be increased.

According to another aspect of the present invention, there is provided a method of manufacturing a semiconductor device exploiting a quantum interference effect comprising:

(a) the step of forming a first semiconductor layer on a semiconductor substrate;

(b) the step of patterning surface of the first semiconductor layer;

(c) the step of forming n−1 (n≧3) rods of forbidden regions extending along one direction, provided separately with each other;

(d) the step of forming a second semiconductor layer that forms a channel region, the channel region consisting of a plurality of elemental channel regions, the forbidden regions being provided to divide the channel region into the plurality of elemental channel regions, each of the elemental channel regions forming a closed circuit and being defined around each of the forbidden regions, the channel region being multiply connected and having (n−1)-fold rotational symmetry around the one direction;

(e) the step of forming a gate electrode surrounding a side wall of the channel region; and (f) the step of forming source and drain electrodes electrically connected to one and another end of the channel region along the one direction.

The above, and other, objects, features and advantage of the present invention will become readily apparent form the following detailed description thereof which is to be read in connection with the accompanying drawings.

BRIEF DESCRIPTION OF THE DRAWINGS

FIGS. 3A to 3E are graphs showing dependency of electron distribution in an effective channel region in the cross section of FIG. 2 on the outer channel width $w_0$;

DETAILED DESCRIPTION OF THE PREFERRED EMBODIMENTS

An embodiment of the invention is described below with reference to the drawings.

Figure 1:
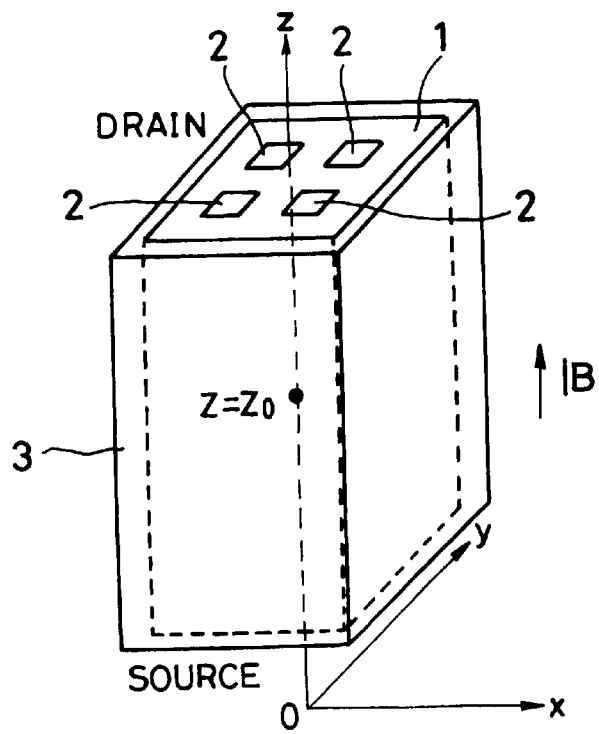
FIG. 1 is a perspective view of a quantum interference semiconductor device according to an embodiment of the invention.

FIG. 1 shows a quantum interference semiconductor device according to an embodiment of the invention.

In the quantum interference semiconductor device shown in FIG. 1, four rod-shaped regions in the form of elongated square prisms extending in the z-axis direction are provided in a square prism-shaped semiconductor body having the z-axis as its central axis and having sides extending in the x, y and z directions. Portion of the square prism-shaped semiconductor body excluding those four rod-shaped regions in the form of elongated square prisms forms a channel region 1 having a quantuply connected structure. These four rod-shaped regions in the form of elongated square prisms are forbidden regions 2 in which no electron can exist (that is, in which the electron wave function is zero). Respective portions of the channel region 1 around the respective forbidden regions 2 form a closed circuit. On a side wall of the channel region 1 is provided a gate electrode 3 surrounding the channel region 1.

As the semiconductor forming the channel region 1, for example, n-type GaAs may be used. The forbidden regions 2 may be made of, for example, p-type AlGaAs. Alternatively, it may be made of a semiconductor other than p-type AlGaAs or other various materials, or may be mere holes. As material of the gate electrode 3 is used a metal or a semiconductor such as $n^+$-type InGaAs that makes a Schottky junction in combination with, for example, n-type GaAs forming the channel region 1.

Figure 2:
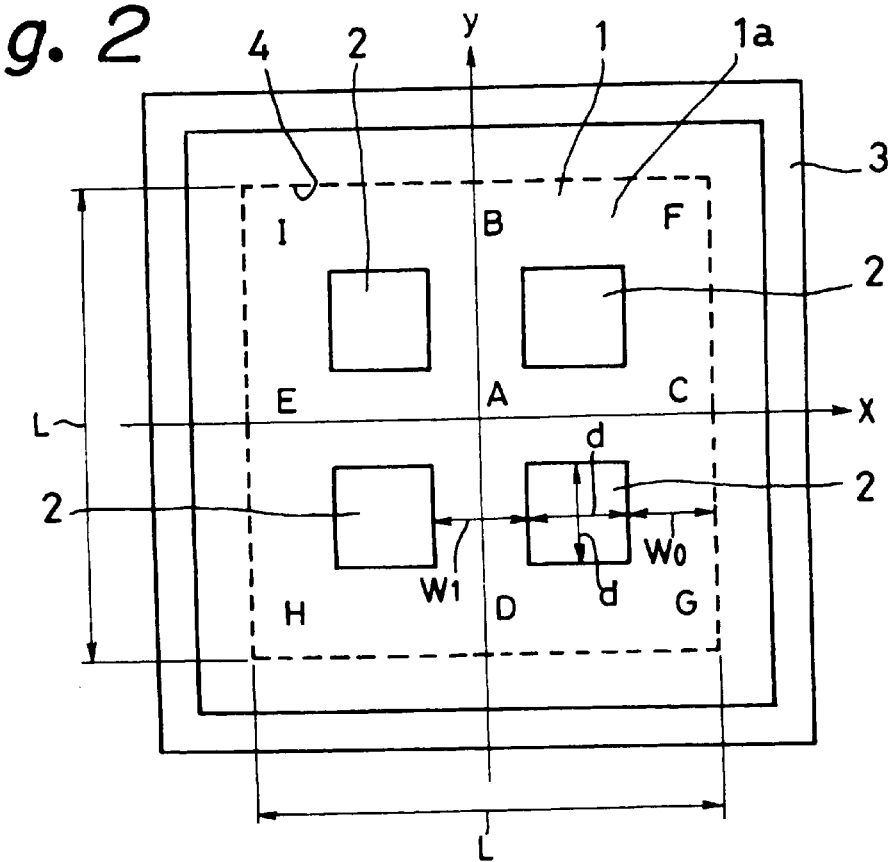
FIG. 2 is an enlarged dross sectional view of the quantum interference semiconductor device taken along a plane parallel to the xy plane at $z=z_0$.

FIG. 2 shows an enlarged cross section taken along a plane parallel to the xy plane at $z=z_0$ (see FIG. 1). In this case, since the gate electrode 3 and the channel region 1 make a Schottky junction, a depletion layer 4 is formed in the channel region 1 at the junction as shown in FIG. 2. Actually, therefore, part of the channel region 1 excluding the depletion layer 4 is the region in which electrons can exit. The part in which electrons can actually exist is called the effective channel region, and it is shown at 1a in FIG. 2. The letter L in FIG. 2 is the length of a side of the effective channel region 1a in the cross section shown in FIG. 2. The width of the depletion layer 4 and, hence, the width of the effective channel region 1a ($w_0$ referred to later) can be controlled by a gate voltage $V_G$ applied to the gate electrode 3.

As shown in FIG. 2, four forbidden regions 2 are symmetrical around the z-axis in intervals of 90 degrees. Therefore, the channel region 1 has both a quantuply connected structure and a four-fold rotational symmetry around the z-axis.

In this embodiment, when viewed in FIG. 1, the lower end to he channel region 1 may be used as its source, and the upper end of the channel region 1 as its drain. Then electrons run in the effective channel region 1a along or around the z-axis direction from the source toward the drain. In this case, a magnetic field B is applied to the channel region 1 in the z-axis direction, and electron interference in the effective channel region 1a is controlled by the magnetic field B (see FIG. 1).

Because the channel region 1 having the quintuply connected structure has the four-fold rotational symmetry around the z-axis, electrons in the effective channel region 1a have a discretized angular momentum with respect to rotation around the z-axis. In addition, the electron distribution in the effective channel region 1a is quasiuniform.

In this embodiment, the width of the effective channel region 1a in a cross section parallel to the xy plane is selected as follows:

When the effective channel region 1a forms a closed circuit in its cross section as shown in FIG. 2, there are bound states as many as the number of cross portions, tee portions and elbow portions in the closed circuit. In the effective channel region 1a shown in FIG. 2, since a cross portion A, tee portions B, C, D and E, elbow portions F, G, H and I make nine in total, there are nine bound states. These nine bound states correspond to states in which electrons are bound to respective intersections of A to I. If the binding is strong, the effective channel region 1a becomes a mere bundle of a number of quantum wires running through the respective portions A to I, and can induce no interference effect.

More specifically, in order to induce an interference effect in the effective channel region 1a, it is essential for these bound states to overlap with each other. This requirement needs the following condition:

$$w_1 \sim d \sim w_0 \tag{1}$$

and, more strictly, the following condition:

$$w_0 = d \pm \epsilon_1 = w_1 \pm \epsilon_2 (0 \leq \epsilon_1, \epsilon_2 \leq 0.3 w_1) \tag{2}$$

where, as shown in FIG. 2, $w_0$ is the width of the outer peripheral portion of the effective channel region 1a (outer channel region), that is, the outer channel width, $w_1$ is the width of the part of the effective channel region 1a located inside the outer channel region (inner channel region), that is, the inner channel width, and d is the length of each side of the forbidden regions 2 in their cross sections, and when $w_1 = d$.

In addition, as will be understood from the following description, when $w_1 = d$, $$1.1 \leq w_0/w_1 \leq 1.3 \tag{3}$$

is required to realize a quasiuniform electron distribution over the entirety of the effective channel region 1a.

FIGS. 3A to 3E show how the electron distributions (wave functions of electrons in the ground state) in the cross section of the effective channel region 1a varies with changes in $w_0$ when $w_1=d=40$ nm. Here, B=0. Values of $w_0/w_1$ in FIGS. 3A to 3E are 0.5, 0.8, 1, 1.2 and 1.4, respectively. It is known from FIGS. 3A to 3E that $w_0$ to 44 nm ($w_0/w_1=1.1$) provides a substantially uniform electron distribution over the entirety of the effective channel region 1a.

Although FIGS. 3A to 3E show electron distributions under the condition of $w_1=d=40$ nm, as long as the value of $w_0w_1$ is constant, the same electron distribution is obtained even when d is not 40 nm. That is, electron distribution is determined by $w_0w_1$.

Figure 4:
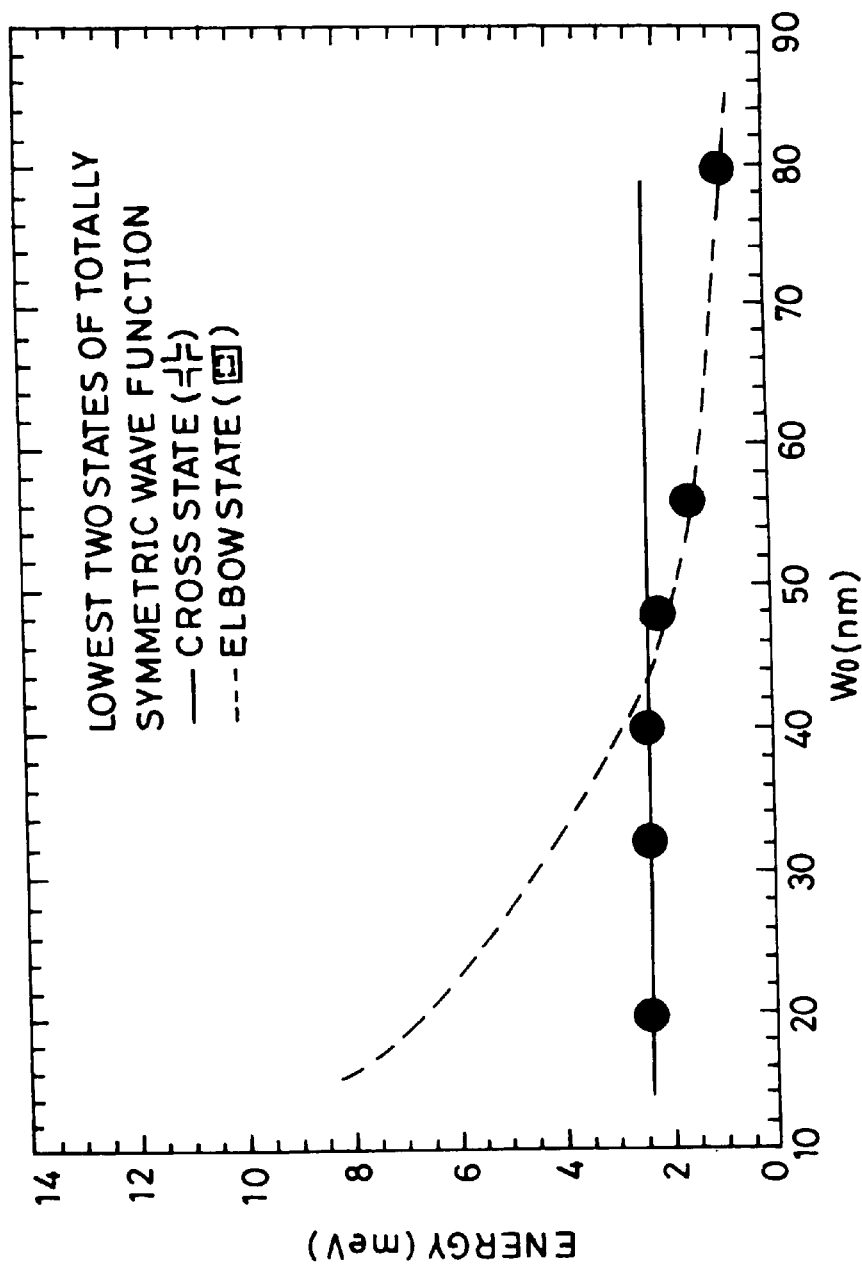
FIG. 4 is a graph in which values of eigenenergy corresponding to the respective electron distributions of FIGS. 3A to 3E are plotted against the outer channel width $w_0$.

FIG. 4 is a graph in which changes in eigenenergy corresponding to the respective electron distributions shown in FIGS. 3A to 3E are plotted against values of $w_0$. It is known from FIG. 4 that the curve of the bound state eigenenergy corresponding to the central cross portion A of the effective channel region 1a intersects at $w_0=44$ nm with the curve of the bound state eigenenergy corresponding to the elbow portions F, G, H ad I at four corners of the effective channel region 1a.

In case that the channel region 1 is make of n-type GaAs and the forbidden regions 2 of p-type AlGaAs, the channel region 1 and the forbidden regions 2 make a heterostructure p-n junction, and a depletion layer is formed at the junction. If the width of the depletion layer is so large that it cannot be ignored, it is necessary to replace $w_0$ and $w_1$ by an effective outer channel width $w_{0eff}$ and an effective inner channel width $w_{1eff}$. In this case, they may be approximated by $w_{1eff}$ to (width of electron distribution in a triangular potential formed at the heterointerface between the channel region 1 and the forbidden regions 2 (to 20 nm)) and by $w_{0eff}=(w_0-$the width of the depletion layer).

In this embodiment, it is essential that, in addition to the foregoing conditions, $w_0$ and $w_1$ are smaller than the inelastic scattering length of electrons in the effective channel region 1a. This is necessary for obtaining coherency of electrons.

As described above, since $w_0$ can be controlled by the gate voltage $V_G$ applied to the gate electrode 3, electron distributions of FIGS. 3A to 3E can be controlled by the gate voltage $V_G$. Approximate values for the gate voltage $V_G$ in some different examples are shown below. Assume here that the channel region 1 is made of n-type GaAs, and the carrier concentration of the n-type GaAs is $10^{23}$ m$^{-3}$. Assume also that the length of one side of the channel region 1 is 640 nm, and $w_1=d=100$ nm. If the electron distribution shown in FIG. 3C is obtained when $V_G$0 V, then $V_G$ necessary for obtaining the electron distribution shown in FIG. 3A is about 1.3 V, and $V_G$ necessary for obtaining the electron distributing shown in FIG. 3E is about −0.6 V. Note that the width of the depletion layer 4 at the time when the electron distribution shown in FIG. 3C is obtained under $V_G=0$ V is 70 nm, the width of the depletion layer 4 at the time when the electron distribution shown in FIG. 3A is obtained under $V_G$1.3 V is 120 nm, and the width of the depletion layer 4 at the time when the electron distribution shown in FIG. 3E is obtained under $V_G=-0.6$ V is 30 nm.

Next, a specific structure for the quantum interference semiconductor device which uses a channel region having a quintuply connected structure and a four-fold rotational symmetry is explained. The outer shape of the channel region in this specific structure is in the form of a regular-octagonal prism, and the forbidden regions are in the form of cylindrical rods. However, the channel region in this specific structure is substantially the same as the channel region shown in FIG. 1.

Figure 5A:
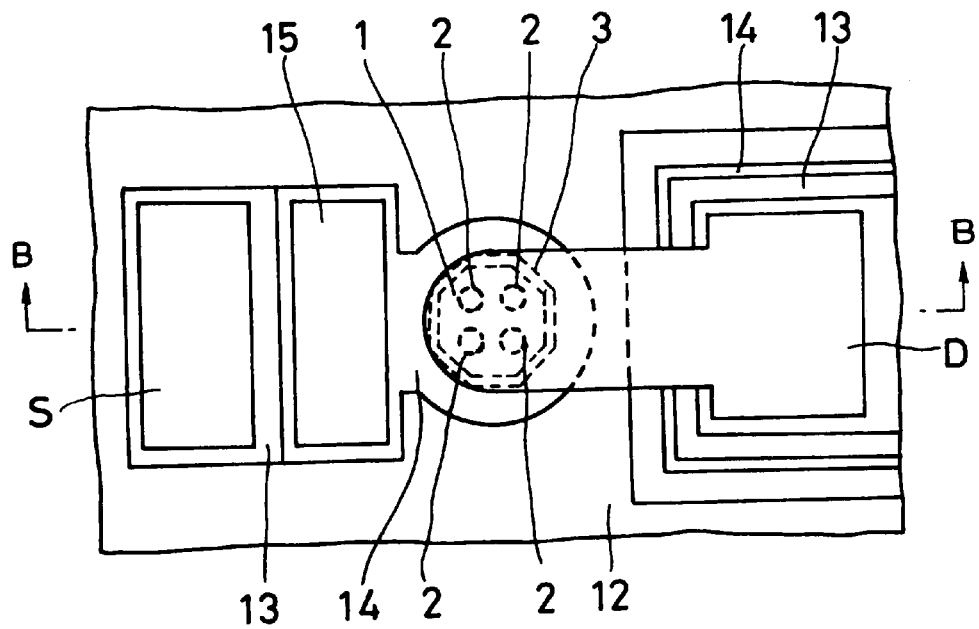
FIG. 5A is a plan view of a specific structure for a quantum interference semiconductor device which uses a channel region having a quantuply connected structure and a four-fold rotational symmetry.
Figure 5B:
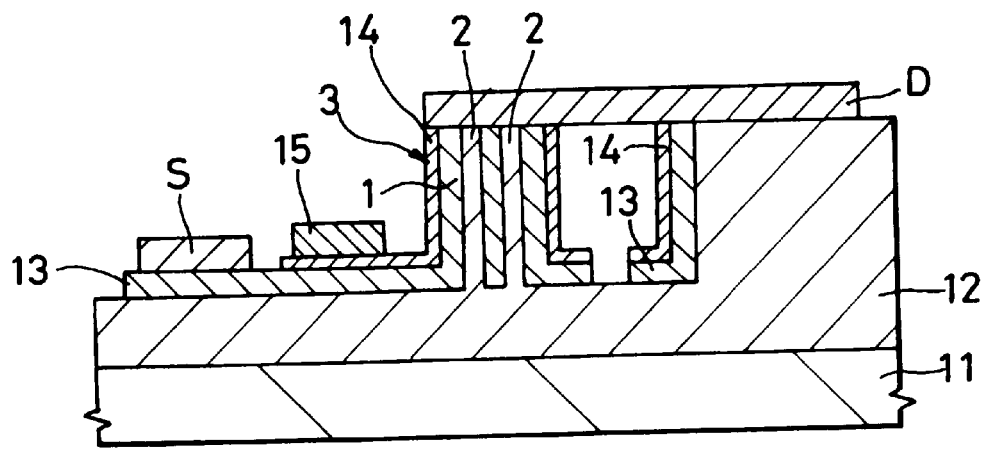
FIG. 5B is a cross sectional view taken along the B—B line of FIG. 5A.

FIG. 5A is a plan view of the quantum interference semiconductor device having the foregoing specific structure, and FIG. 5B is a cross sectional view taken along the B—B line of FIG. 5A.

In FIGS. 5A and 5B, reference numeral 11 refers to, for example, a semiinsulating GaAs substrate, and 12 to, for example, a p-type AlGaAs layer. In this case, four forbidden regions 2 are part of the p-type AlGaAs layer 12, and each has the configuration of a cylindrical rod as mentioned above. Reference numeral 13 denotes, for example, an n-type GaAs layer. The channel region 1 is part of the n-type GaAs layer 13. The outer shape of the channel region 1 enclosing the forbidden regions 2 has a regular-octagonal prism configuration as mentioned above. The gate electrode 3 in the form of an n$^+$-type InGaAs layer is provided on a side wall of the channel region 1 is provided so as to surround the channel region 1. On one end of the gate electrode 3 is provided an electrode 14 made of a material which forms ohmic contact with the gate electrode 3. Reference characters S and D refer to source and drain electrodes electrically connected with one end and another end of the channel region 1, respectively. The source electrode S is made of a material which forms ohmic contact with n-type GaAs, and the drain electrode D is made of a material which forms ohmic contact with p-type AlGaAs. Material for the source electrode S and the drain electrode D may be, for example, Au/Ge alloy.

Figure 6A:
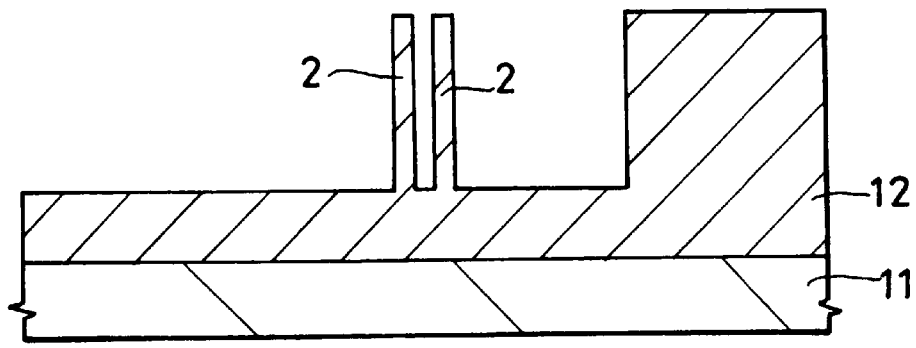
FIGS. 6A to 6C are cross sectional views illustrating a manufacturing method of the quantum interference semiconductor device shown in FIGS. 5A and 5B.

The quantum interference semiconductor device shown in FIGS. 5A and 5B can be manufactured as follows:

First, as shown in FIG. 6A, the p-type AlGaAs layer 12 is epitaxially grown on the semiinsulating GaAs substrate 11 by, for example, metalorganic chemical vapor deposition (MOCVD) method, followed by patterning the p-type AlGaAs layer 12 by etching to form the forbidden regions 2 or the like.

Figure 6B:
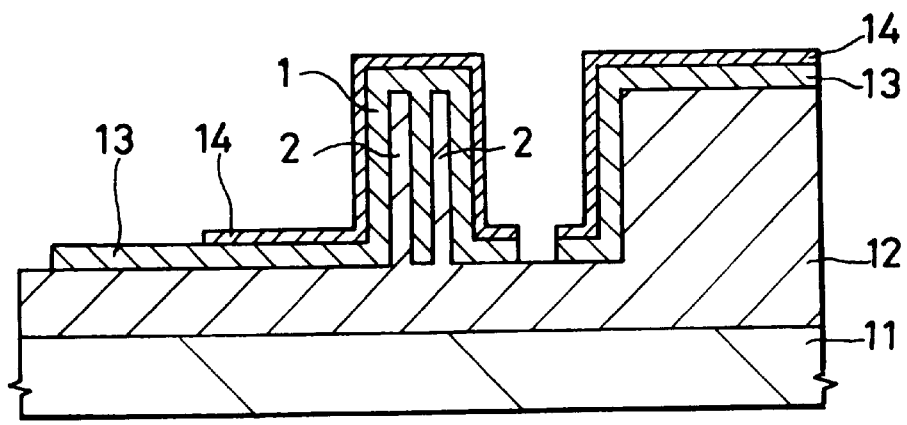

Next, as shown in FIG. 6B, the n-type GaAs layer 13 and the n$^+$-type InGaAs layer 14 are epitaxially grown in sequence on the entire surface by the MOCVD method again, followed by patterning the n$^+$-type InGaAs layer 14 and the n-type GaAs layer 13 into predetermined patterns by etching.

Figure 6C:
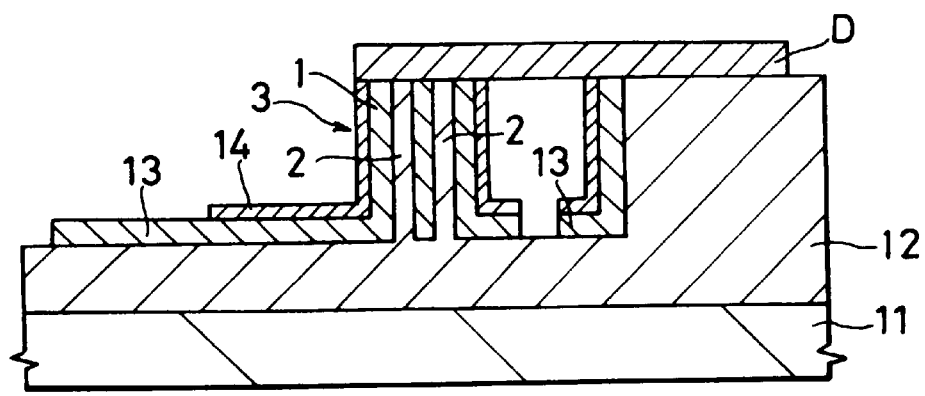

Next, after flattening the surface of the structure shown in FIG. 6B by applying flattening substance (not shown) in cavities in the surface, the structure is etched back in a direction normal to the surface of the substrate to a depth to expose at leas the upper ends of the forbidden regions 2. Next, after an Au/Ge alloy layer is formed on the entire part of the flattened surface, the Au/Ge alloy layer is patterned into the form of the drain electrode D by etching. Thereafter, the flattening substance is removed. This state is shown in FIG. 6C.

Next, after a mask (not shown) covering at least the drain electrode D is formed, an Au/Ge alloy film is formed on the entire surface. The Au/Ge alloy film is then patterned into the form of the source electrode S and the electrode 15 by etching. Thereby, the quantum interference semiconductor device shown in FIGS. 5A and 5B is completed.

As described above, according to the embodiment, by using the channel region 1 having a quintuply connected structure and having a four-fold rotational symmetry in its cross section, it is possible to realize an advance interference effect and a variety in interference modes that are not obtained by existing quantum interference devices using a channel region of only doubly connected structure.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. A method of manufacturing a semiconductor device exploiting a quantum interference effect comprising:

(a) the step of forming a first semiconductor layer on a semiconductor substrate;

(b) the step of patterning surface of said first semiconductor layer;

(d) the step of forming n−1 (n≧3) rods of forbidden regions extending along one direction, provided separately with each other;

(d) the step of forming a second semiconductor later that forms a channel region, said channel region consisting of a plurality of elemental channel regions, said forbidden regions being provided to divide said channel region into said plurality of elemental channel regions, each of said elemental channel regions forming a closed circuit and being defined around each of said forbidden regions, said channel region being multiply connected and having (n−1)-fold rotational symmetry around said one direction;

(e) the step of forming a gate electrode surrounding a side wall of said channel region; and (f) the step of forming source and drain electrodes electrically connected to one and another end of said channel region along said one direction.

2. The method according to claim 1 wherein said first semiconductor layer consists of p-type AlGaAs and said second semiconductor layer consists of n-type GaAs.

3. The method according to claim 1 or 2 wherein said gate electrode consists of $n^+$-type InGaAs.

* * * * *